(12) United States Patent
Takazawa et al.

(10) Patent No.: US 6,787,817 B2
(45) Date of Patent: Sep. 7, 2004

(54) COMPOUND SEMICONDUCTOR HAVING A DOPED LAYER BETWEEN THE GATE AND AN OHMIC CONTACT OF AN ACTIVE REGION

(75) Inventors: Hiroyuki Takazawa, Hino (JP);
Shinichiro Takatani, Koganei (JP);
Masao Yamane, Takasaki (JP);
Masayoshi Kobayashi, Takasaki (JP)

(73) Assignee: Renesas Technology Corporation, Tokyo (JP)

( * ) Notice: Subject to any disclaimer, the term of this patent is extended or adjusted under 35 U.S.C. 154(b) by 11 days.

(21) Appl. No.: 10/318,244

(22) Filed: Dec. 13, 2002

(65) Prior Publication Data

US 2003/0168672 A1 Sep. 11, 2003

(30) Foreign Application Priority Data

Mar. 6, 2002 (JP) ........................................ 2002-059905

(51) Int. Cl.[7] .......................................... H01L 31/0328
(52) U.S. Cl. ........................ 257/183; 257/200; 257/201
(58) Field of Search .................................. 257/183–201

(56) References Cited

FOREIGN PATENT DOCUMENTS

| JP | 4-186845 | 7/1992 |
| JP | 06-021101 | 1/1994 |
| JP | 08-274118 | 10/1996 |
| JP | 10-214848 | 8/1998 |

OTHER PUBLICATIONS

"Physics of Semiconductor Devices (Second Edition)" S.M. Sze, p. 45, p. 14 lines 10–14.

"High Performance $In_{0.5}Al_{0.5}As/In_{0.5}Ga_{0.5}$ As High Electron Mobility Transistors on GaAs" Jpn. J. Appl. Phys. vol. 35 (1996) pp. 5642–5645, Part 1, No. 11, November 1996—cited on p. 24, lines 12–14.

*Primary Examiner*—Fetsum Abraham
(74) *Attorney, Agent, or Firm*—Antonelli, Terry, Stout & Kraus, LLP

(57) ABSTRACT

The present invention provides a semiconductor device for high frequency application having a high breakdown voltage and the method of manufacturing thereof. A region including a first conductivity type high impurity concentration semiconductor and a region including a first conductivity type low impurity concentration semiconductor are provided from an ohmic layer side at the side far from a semiconductor substrate of the end surface of a barrier layer opposite the semiconductor substrate and between the ohmic layer and a gate electrode. The sheet impurity concentration of the region including a first conductivity type low impurity concentration semiconductor is set to be lower than that between the bottom surface of the gate electrode at the side of the semiconductor substrate and the end surface of the channel layer opposite the semiconductor substrate. The sheet impurity concentration of the region including a first conductivity type high impurity concentration semiconductor is set to be higher than that of the region including a first conductivity type low impurity concentration semiconductor.

6 Claims, 13 Drawing Sheets

COMPOUND SEMICONDUCTOR HAVING A DOPED LAYER BETWEEN THE GATE AND AN OHMIC CONTACT OF AN ACTIVE REGION

BACKGROUND OF THE INVENTION

1. Field of the Invention

The present invention relates to a semiconductor device which is represented by HEMT (High Electron Mobility Transistor) and the method of manufacturing thereof.

2. Description of the Related Art

In recent years, wireless LAN (Local Area Network) and equipment such as an automobile radar using a millimeter wave (a 30 to 300 GHz frequency band) and a sub-millimeter wave (several to 30 GHz frequency band) have been developed increasingly. In the wireless LAN and the equipment such as an automobile radar, a high output amplifier is used as their component. Since the high output amplifier performs a high output operation, a semiconductor device as its basic device is required to have a high breakdown voltage.

As a technique related to improvement in high breakdown voltage of HEMT, one of semiconductor devices for such application, Japanese Published Unexamined Patent Application No. Hei 4-186845 (a prior art example 1) discloses a field-effect transistor (FET) of an offset construction which improves reproducibility of breakdown voltage between gate and drain and mass productivity to provide high gain. In addition, Japanese Published Unexamined Patent Application No. Hei 6-21101 (a prior art example 2) discloses a Schottky gate type field-effect transistor in which a convex part is provided in a recess region between a gate electrode and a drain electrode, a recess width is shortened in a dummy manner to provide high output, and the gap between the electrodes is increased for improvement in high breakdown voltage.

Japanese Published Unexamined Patent Application No. Hei 8-274118 (a prior art example 3) discloses a field-effect type semiconductor device which releases local electric field concentration to improve a breakdown voltage and eliminates variation in high frequency characteristic due to variation in mask alignment. Japanese Published Unexamined Patent Application No. Hei 10-214848 (a prior art example 4) discloses a field-effect transistor which can reduce parasitic capacitance and drain conductance and is hard to cause a short channel effect.

SUMMARY OF THE INVENTION

In the above prior art examples 1 to 4, the breakdown voltage in the on state described later in embodiments is low as about 10V and a drain voltage margin to breakdown is small. The drain breakdown voltage margin is insufficient. Since the drain voltage margin is small, the examples are weak to breakdown due to a surge voltage. They cannot be applied to all high frequency systems typically used and are limited.

An object of the present invention is to provide a semiconductor device which has small variation in manufacture, can reduce the manufacturing cost and has high frequency and high breakdown voltage characteristics. Another object of the present invention is to provide the method of manufacturing thereof.

The above objects can be achieved by the following semiconductor devices As shown in FIG. 1 as an essential part, sectional diagram of a semiconductor device of the present invention, a semiconductor device in which on a semiconductor substrate 1, a buffer layer 2, a channel layer 3, a first conductivity type carrier providing layer 4 and a barrier layer 5 are formed from the side of the semiconductor substrate 1, and a source electrode 8, a drain electrode 9, a gate electrode 10 between the source electrode 8 and the drain electrode 9, an ohmic layer 6 connected electrically to the source electrode 8, and an ohmic layer 7 connected electrically to the drain electrode 9 are formed, wherein a region 11 including a first conductivity type high impurity concentration semiconductor and a region 12 including a first conductivity type low impurity concentration semiconductor are formed from the side of the ohmic layer 7 at the side far from the semiconductor substrate 1 of the end surface of the barrier layer 5 opposite the semiconductor substrate 1 and between the ohmic layer 7 and the gate electrode 10, the sheet impurity concentration of the region 12 including a low impurity concentration semiconductor is lower than that between the bottom surface of the gate electrode 10 at the side of the semiconductor substrate 1 and the end surface of the channel layer 3 opposite the semiconductor substrate 1, and the sheet impurity concentration of the region 11 including a high impurity concentration semiconductor is higher than that of the region 12 including a low impurity concentration semiconductor. In addition, as shown in FIG. 2 as an essential part, plan view of the semiconductor device of the present invention, the region 11 including a high impurity concentration semiconductor and the region 12 including a low impurity concentration semiconductor are formed consecutively between one end surface 20 of an operating region of the semiconductor device and the other end surface 21 facing the end surface 20, respectively.

FIG. 1 is a sectional view taken along line I–I' of FIG. 2. The reference numeral 30 of FIG. 2 denotes a wiring connection pad part of the gate electrode 10. In FIGS. 1 and 2, the wiring is omitted.

Further, the above objects can be achieved by the method of manufacturing the semiconductor device including the steps of: stacking, on a semiconductor substrate 1, a buffer layer 2, a channel layer 3, a first conductivity type carrier providing layer 4, a barrier layer 5, an ohmic layer 6 and a first conductivity type ohmic layer 7 from the side of the semiconductor substrate 1; forming a source electrode 8 and a drain electrode 9; processing the first conductivity type ohmic layer to form the ohmic layer 6 connected electrically to the source electrode 8 and the ohmic layer 7 connected electrically to the drain electrode 9; forming, between a gate electrode 10 formed in the later step and the ohmic layer 7, a region 12 including a low impurity concentration semiconductor having a sheet impurity concentration lower than that between the bottom surface of the gate electrode 10 at the side of the semiconductor substrate 1 and the end surface of the channel layer 3 opposite the semiconductor substrate 1 so as to be consecutive between one end surface 20 of an operating region of the semiconductor device and the other end surface 21 facing the end surface; forming, between the gate electrode 10 and the region 12, a region 11 including a high impurity concentration semiconductor having a sheet impurity concentration higher than that of the region 12 so as to be consecutive between one end surface 20 of an operating region of the semiconductor device and the other end surface 21 facing the end surface 20; and forming the gate electrode 10.

The above objects and other objects of the present invention will be apparent by the following detailed description and the attached claims with reference to the accompanying drawings.

DETAILED DESCRIPTION OF THE PREFERRED EMBODIMENTS

Figure 1:
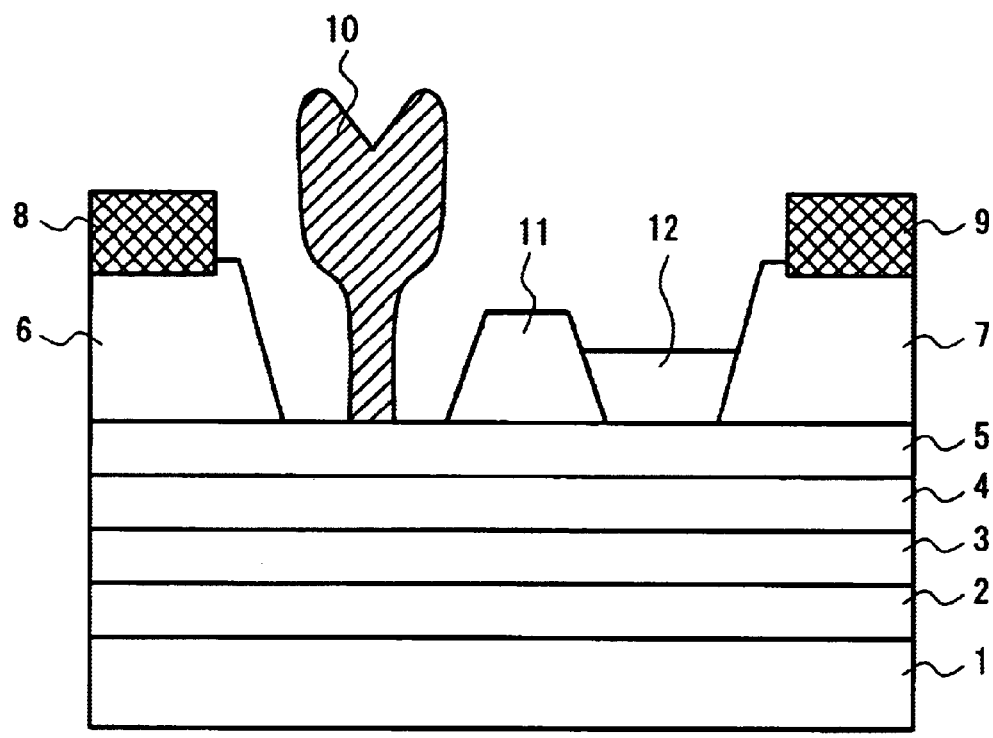
FIG. 1 is an essential part, sectional structure diagram showing the feature of a semiconductor device of the present invention.
Figure 2:
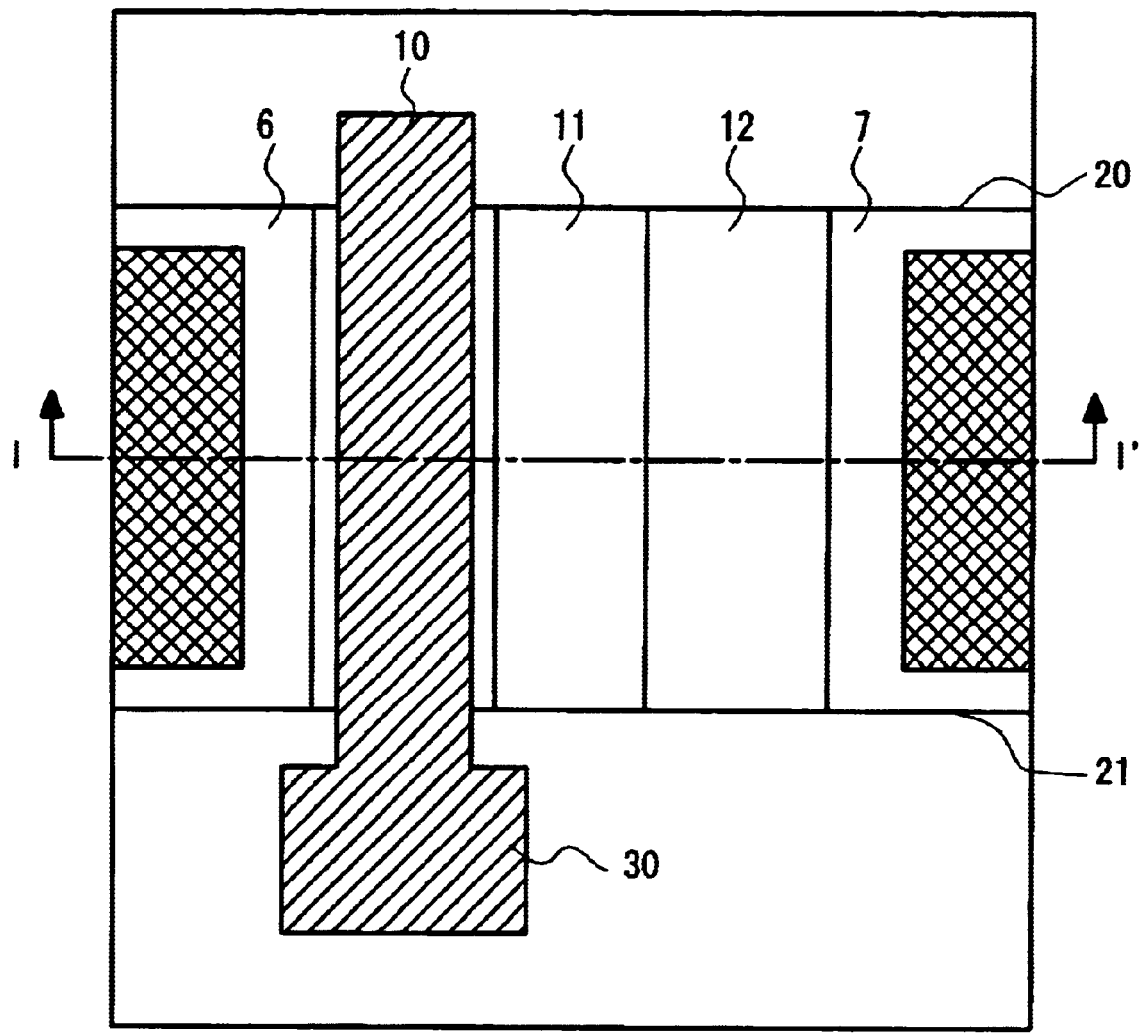
FIG. 2 is an essential part, plan structure diagram showing the feature of the semiconductor device of the present invention.
Figure 3:
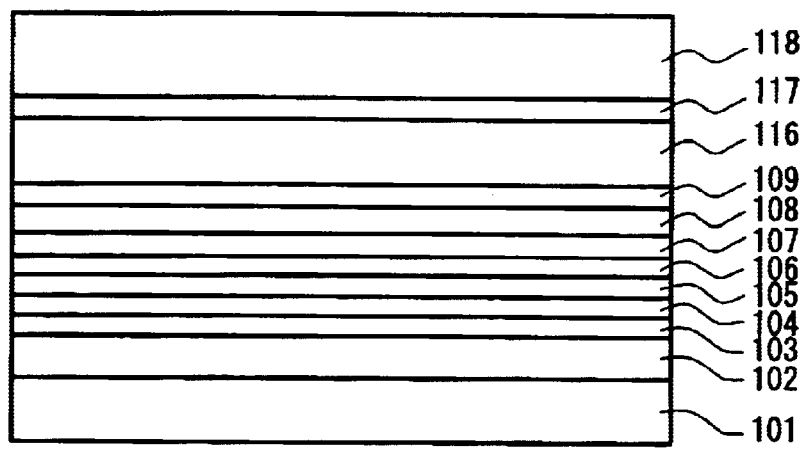
FIG. 3 is a first essential part, sectional structure diagram showing, in step order, an embodiment of the method of manufacturing the semiconductor device according to the present invention.
Figure 4:
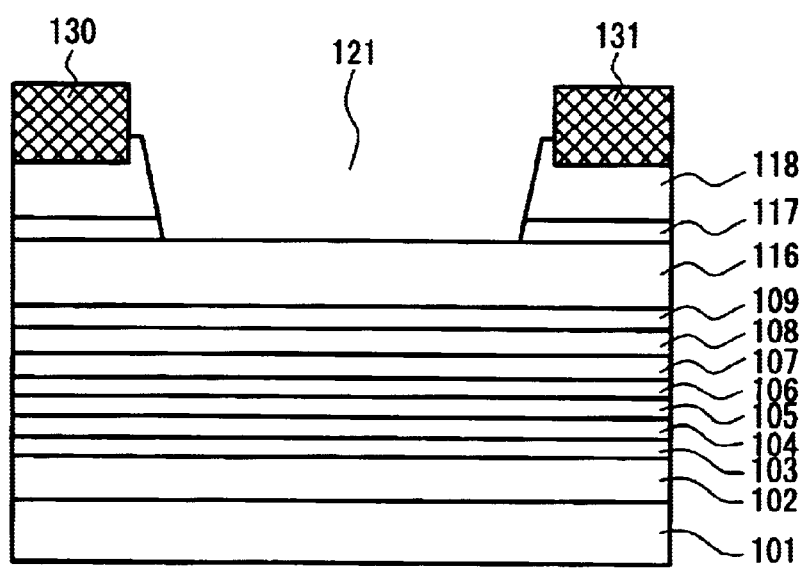
FIG. 4 is a sectional structure diagram of the semiconductor device showing the next step of FIG. 3.

Preferred embodiments of a semiconductor device and the method of manufacturing thereof according to the present invention will be described below in detail with reference to the accompanying drawings.

<Embodiment 1>

Using FIGS. 3 to 9, an embodiment of a semiconductor device and the method of manufacturing thereof according to the present invention will be described. FIGS. 3 to 8 are essential part, sectional views showing the method of manufacturing the semiconductor device according to the present invention. FIG. 9 is an essential part, plan view.

On a semi-insulating GaAs substrate 101, using a Metal Organic Chemical Vapor Deposition (MOCVD) method, there is conducted crystal growth of a buffer layer 102 of non-doped AlGaAs (Al composition: 0.25, thickness: 300 nm) from the substrate side; a substrate side carrier providing layer 103 of n-AlGaAs (Al composition: 0.25, thickness: 10 nm, Si concentration $1 \times 10^{18}$ cm$^{-3}$); a substrate side spacer layer 104 of non-doped AlGaAs (Al composition: 0.25, thickness: 2 nm) and non-doped GaAs (thickness: 2 nm) from the substrate side; a channel layer 105 of non-doped InGaAs (In composition: 0.25, thickness: 8 nm); a gate electrode side spacer layer 106 of non-doped GaAs (thickness: 2 nm) and non-doped AlGaAs (Al composition: 0.25, thickness: 2 nm) from the substrate side; a gate electrode side carrier providing layer 107 of n type AlGaAs (Al composition: 0.22, thickness: 4 nm, Si concentration: $5 \times 10^{18}$ cm$^{-3}$), a planar doped layer (Si sheet impurity concentration: $4 \times 10^{12}$ cm$^{-2}$) and n type AlGaAs (Al composition: 0.22, thickness: 8 nm, Si concentration: $4 \times 10^{18}$ cm$^{-3}$) from the substrate side; a barrier layer 108 of n type AlGaAs (Al composition: 0.22, thickness: 14 nm, Si concentration: $5 \times 10^{16}$ cm$^{-3}$); a first etching stop layer 109 of n type AlGaAs (Al composition: 0.22, thickness: 3 nm, Si concentration: $5 \times 10^{18}$ cm$^{-3}$), a planar doped layer (Si sheet impurity concentration: $4 \times 10^{12}$ cm$^{-2}$) and n type AlGaAs (Al composition: 0.22, thickness: 2 nm, Si concentration: $5 \times 10^{18}$ cm$^{-3}$) from the substrate side; a first cap layer 116 of n type GaAs (thickness: 70 nm, Si concentration: $5 \times 10^{18}$ cm$^{-3}$); a second etching stop layer 117 of n type AlGaAs (Al composition: 0.15, thickness: 3 nm, Si concentration: $5 \times 10^{18}$ cm$^{-3}$), a planar doped layer (Si sheet impurity concentration: $4 \times 10^{12}$ cm$^{-2}$) and n type AlGaAs (Al composition: 0.15, thickness: 3 nm, Si concentration: $5 \times 10^{18}$ cm$^{-3}$) from the substrate side; and a second cap layer 118 of n type GaAs (thickness: 110 nm, Si concentration: $5 \times 10^{18}$ cm$^{-3}$) (see FIG. 3).

Isolation is conducted by mesa etching using a photolithography technique and a semiconductor wet etching technique to form an end surface of the active region of the semiconductor device (not shown). As a wet etching solution, a mixed solution of phosphoric acid, hydrogen peroxide and pure water is used.

Part of the second cap layer 118 is removed using the photolithography technique and a reactive ion etching technique. Part of the third etching stop layer 117 is removed by a wet process to form a recess 121. A source electrode 130 and a drain electrode 131 are formed by a metalizing technique and liftoff. The stacked structure of AuGe/Mo/Au from the substrate side is used as the material of the source electrode 130 and the drain electrode 131 and is heat treated (400° C., 5 min) in a nitrogen atmosphere after material deposition (see FIG. 4). The etching gas used for the reactive ion etching is a mixed gas of $SiCl_4$ and $CHF_3$. The aqueous solution used for the wet process is an aqueous ammonia solution.

Figure 5:
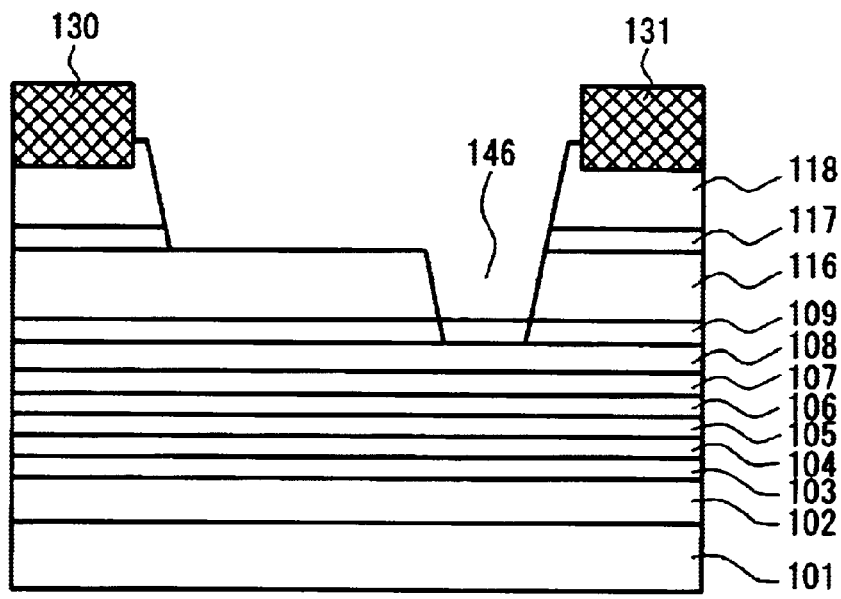
FIG. 5 is a sectional structure diagram of the semiconductor device showing the next step of FIG. 4.
Figure 6:
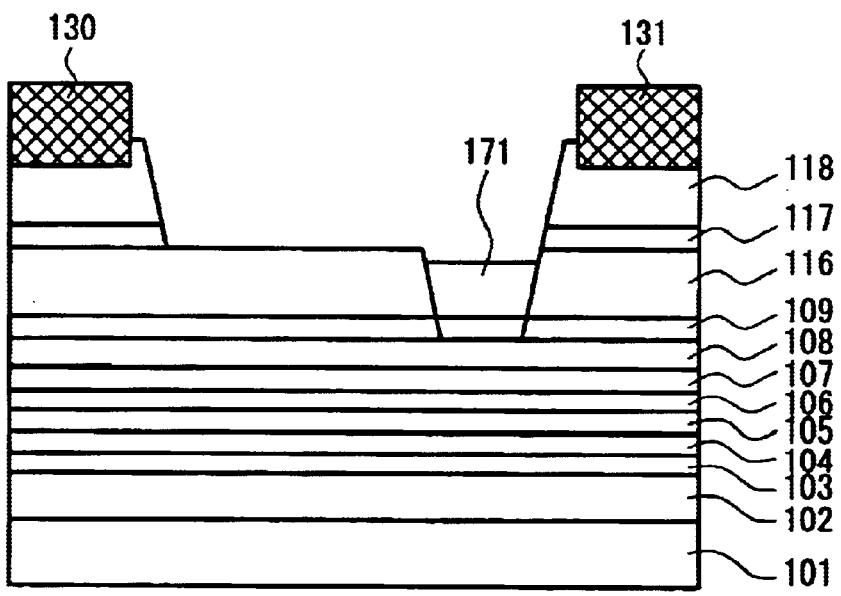
FIG. 6 is a sectional structure diagram of the semiconductor device showing the next step of FIG. 5.
Figure 7:
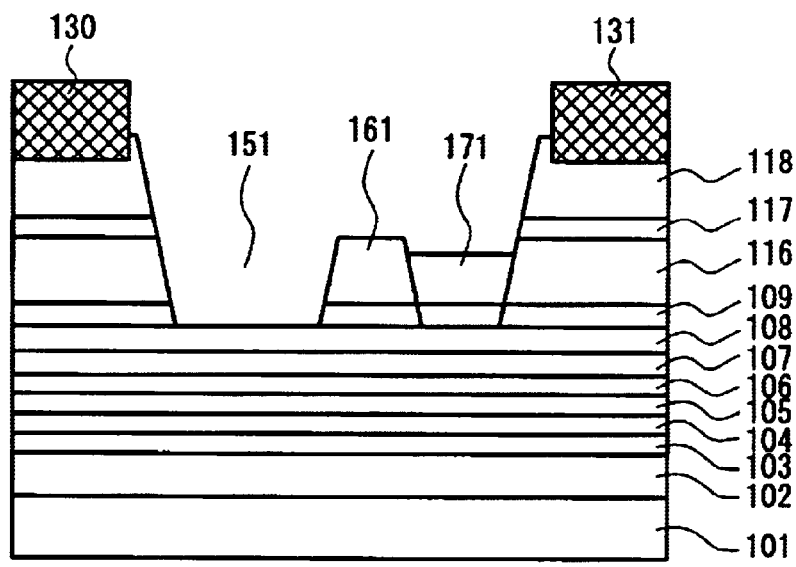
FIG. 7 is a sectional structure diagram of the semiconductor device showing the next step of FIG. 6.

After stacking an insulator film (not shown), a drain electrode side recess 146 is made using an electron beam drawing technique, an insulator film etching technique and a wet etching technique using a citric acid etching aqueous solution (see FIG. 5). An n type GaAs (thickness: 30 nm, Si concentration: $5 \times 10^{17}$ cm$^{-3}$) 171 as a region including a low impurity concentration semiconductor is formed in the recess 146 using a selective semiconductor growth technique (see FIG. 6). For the selective semiconductor growth technique, it is possible to use the technique described in Japanese Published Unexamined Patent Application No. Hei 5-226376.

A gate recess 151 is formed using the wet etching technique using a citric acid etching aqueous solution. At the same time, a region 161 including a high impurity concentration semiconductor is formed (see FIG. 7). A gate electrode 132 is formed using the deposition method to complete a semiconductor device (see FIG. 8). A threshold voltage Vth of the semiconductor device in this embodiment is about −1.5V.

Figure 8:
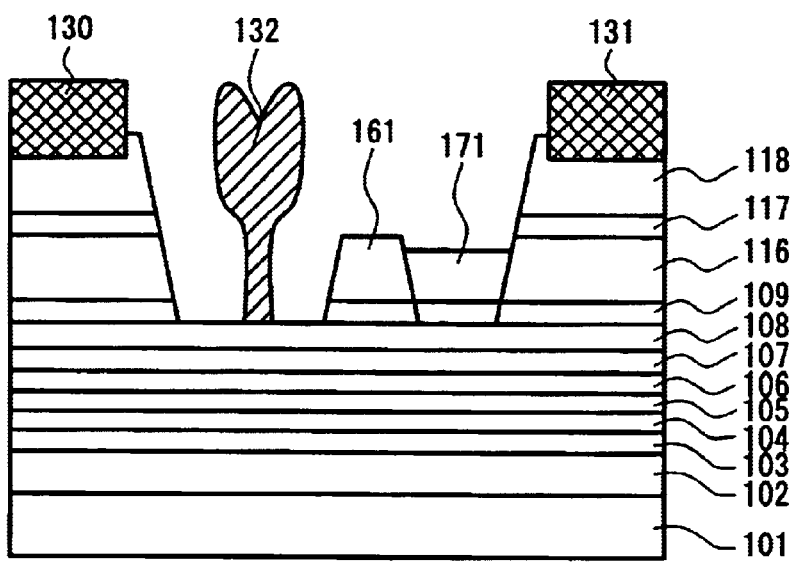
FIG. 8 is a sectional structure diagram of the semiconductor device showing the next step of FIG. 7.
Figure 9:
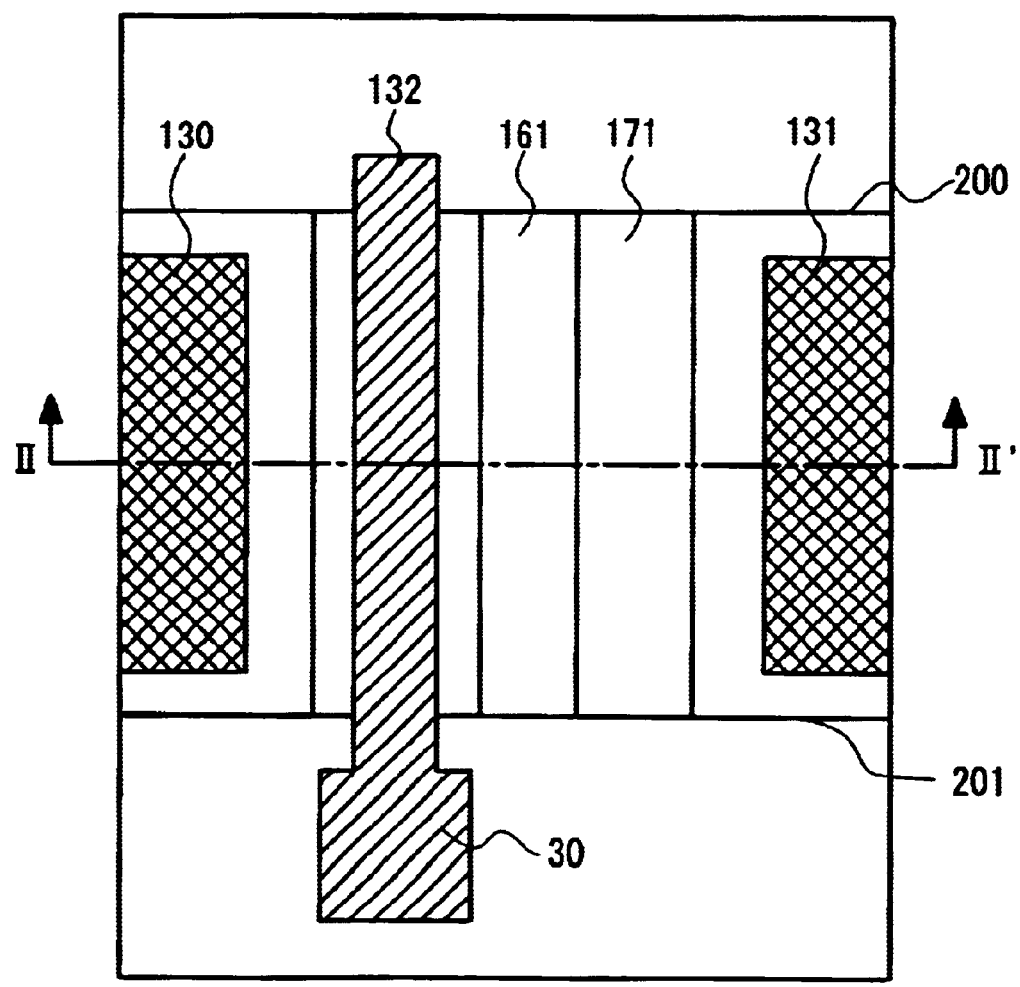
FIG. 9 is a plan view of the semiconductor device shown in FIG. 8.

FIG. 9 is an essential part, plan view of the semiconductor device shown in FIG. 8. As shown in FIG. 9, the region 161 including a high impurity concentration semiconductor and the region 171 including a low impurity concentration semiconductor are formed consecutively between one end surface 200 of an operating region of the semiconductor device and the other end surface 201 facing the end surface 200. The sectional view of FIG. 8 shows a sectional structure of the part taken along line II–II' shown in FIG. 9. In FIG. 9, the reference numeral 30 denotes a wiring connection pad part of the gate electrode 132. In FIGS. 8 and 9, the wiring is omitted.

Figure 17:
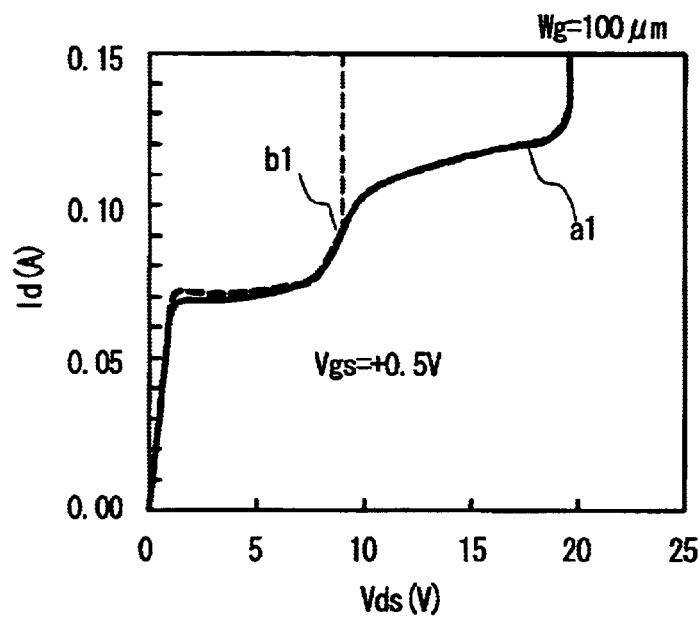
FIG. 17 is a characteristic diagram showing drain electric current characteristics to drain voltages of the semiconductor device according to the present invention of the structure shown in FIG. 8 and a prior art semiconductor device.

A drain electric current characteristic Id to a drain voltage Vds of the semiconductor device of this embodiment is indicated by a characteristic a1 of FIG. 17. The semiconductor device has a gate width Wg of 100 μm and a gate voltage Vgs of +0.5V. When the breakdown voltage (hereinafter, called an on state breakdown voltage. A voltage exceeding the on state breakdown voltage is applied to cause a breakdown in the semiconductor device.) under such voltage conditions (on state) is expressed by the drain-source voltage Vds, it can be a very large value of about 19V.

Typically, the operating range of the drain voltage when the semiconductor device is operated at high frequency is known to be within about twice the power supply voltage. The power supply voltage of the high frequency system typically used is 2.5 to 5V. The operating range of the drain voltage is within 10V at the maximum. A difference between the on state breakdown voltage and the maximum operating drain voltage in the semiconductor device of this embodiment is about 10V. The semiconductor device of this embodiment has a sufficient drain voltage margin to breakdown. Such margin can suppress breakdown due to a surge voltage. The semiconductor device of the present invention has a sufficient reliability.

When simulating the drain electric current characteristic to the drain voltage when using the technique described in the above prior art example 1 (Japanese Published Unexamined Patent Application No. Hei 4-186845), the result as shown in a characteristic b1 of FIG. 17 is obtained. The semiconductor device of the prior art example 1 has a threshold voltage of −1.5V, a gate width Wg of 100 μm, and a gate voltage Vgs of +0.5V. From the characteristic b1, an on state breakdown voltage is about 9V.

The breakdown voltage cannot respond to all high frequency systems typically used. When the prior art is used, the applied system is limited. In the case of a system having a power supply voltage of 3.5V, the maximum operating drain voltage of the semiconductor device is about 7V. The drain voltage margin to breakdown is slight as about 2V. The drain voltage margin is insufficient. When the drain voltage margin is slight as about 3V, breakdown due to a surge voltage cannot be suppressed.

The simulation result of the drain electric current characteristic to the drain voltage when using the techniques described in the prior art example 2 (Japanese Published Unexamined Patent Application No. Hei 6-21101) and the prior art example 3 (Japanese Published Unexamined Patent Application No. Hei 8-274118) is almost the same as that of the characteristic b1 of FIG. 17. The on state breakdown voltage is about 9V. The prior art examples 2 and 3 have the same disadvantage as that of the technique described in the prior art example 1.

Figure 19:
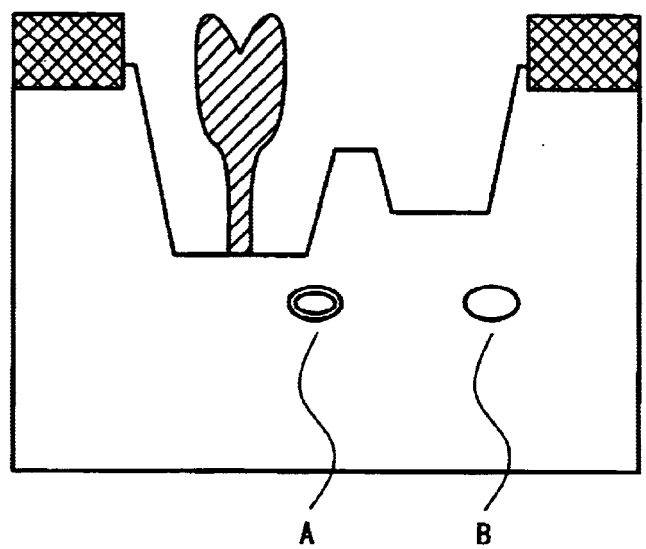
FIG. 19 is a diagram showing parts as maximum regions of impact ionization factors obtained from device simulation in the essential part, sectional structure diagram of the semiconductor device according to the present invention shown in FIG. 8.
Figure 20:
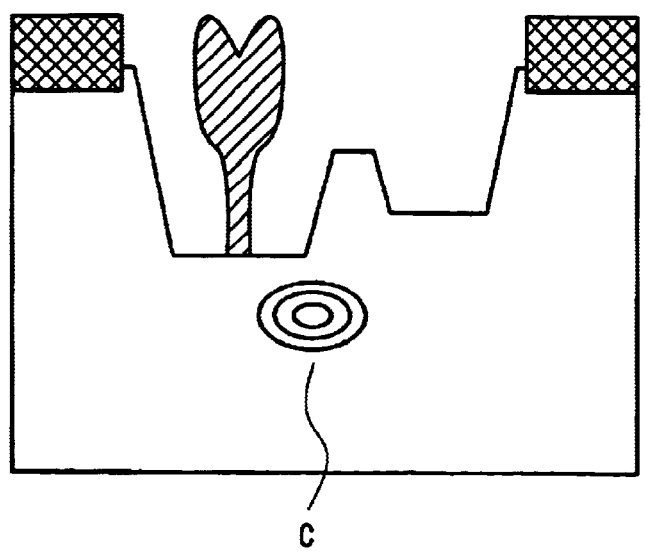
FIG. 20 is a diagram showing a part as a maximum region of an impact ionization factor obtained from device simulation in the essential part, sectional structure diagram of the semiconductor device when using the technique described in a prior art example 1.

That the semiconductor device of this embodiment has a sufficiently large on state breakdown voltage will be described using FIGS. 19 to 21. FIG. 19 is an essential part, sectional structure diagram of the semiconductor device of this embodiment. The parts indicated by A and B are maximum regions of impact ionization factors (hereinafter, referred to as G) calculated by device simulation. FIG. 20 is an essential part, sectional structure diagram of the semiconductor device when using the technique described in the prior art example 1. The part indicated by C is a maximum region of the impact ionization factor G calculated by device simulation.

The positions of the parts from A to C exist within the channel of the semiconductor devices. In FIGS. 19 and 20, the detailed description of the semiconductor layer is omitted for simplification. The impact ionization factor G is a value expressed by an equation (81) in page 45 of Physics of Semiconductor Devices Second Edition, John Wiley & Sons, Inc., 1981 written by S. M. Sze and is expressed by an electron or hole ionization factor, a concentration and a transit velocity. As the G value is increased, the occurrence probability of the electron-hole pair is large. The drain electric current and the gate electric current of the semiconductor device are increased to easily cause a breakdown in the semiconductor device.

Figure 21:
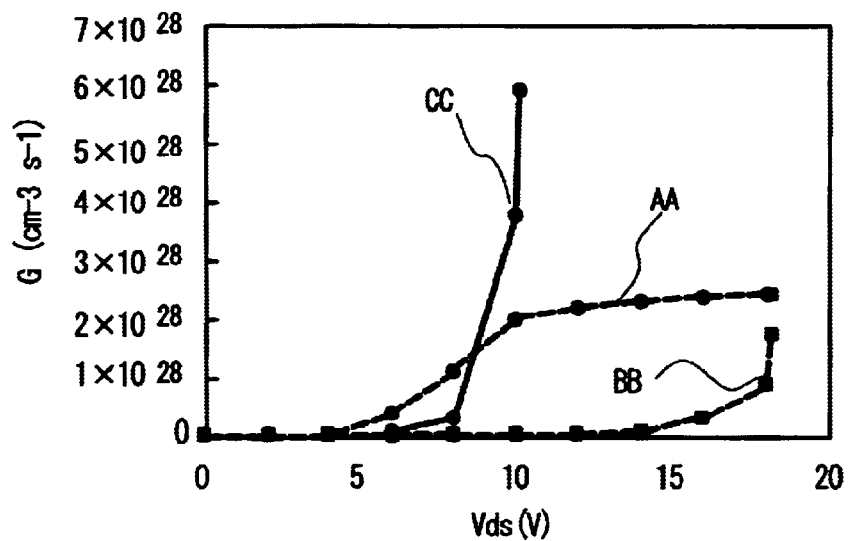
FIG. 21 is a diagram showing impact ionization factors and their drain voltage dependence.

FIG. 21 is a diagram showing how the G value of each of the positions of the parts A to C are changed depending on the drain voltage. A characteristic AA shown in FIG. 21 corresponds with the part A; a characteristic BB, the part B; and a characteristic CC, the part C. As indicated by the characteristic AA, the G value is largely increased at drain voltages of 4 to 10V. The increased amount is reduced at above 10V and is saturated at about $2 \times 10^{28}$ cm$^{-3}$s$^{-1}$. Instead of that, as indicated by the characteristic BB, the G value starts increasing at a drain voltage of above 10V (although not shown here, when the vertical axis of FIG. 21 is LOG displayed, it is clear that the G value starts increasing at a drain voltage of above 10V.). When it exceeds 18V, the G value is increased abruptly to cause a breakdown in the semiconductor device. When a drain voltage of 8V is exceeded on the characteristic CC, the G value is increased abruptly to cause a breakdown in the semiconductor device.

As the semiconductor device of this embodiment, the region including a high impurity concentration semiconductor and the region including a low impurity concentration semiconductor are formed from the gate electrode side. The increased region of the impact ionization factor G can be distributed into two parts. The G increase can thus be suppressed. The on state breakdown voltage can be increased. When using the prior art, it can be concluded that the increased region of G is concentrated onto one part so that the G increase cannot be suppressed and the on state breakdown voltage cannot be increased sufficiently.

When using the techniques described in the prior art examples 2 and 3, the increased region of G exists at only one part as shown in FIG. 20. The drain voltage dependence of the G value shows almost the same change as that of the characteristic CC of FIG. 21 (not shown).

As described above, the semiconductor device of this embodiment can obtain the effect for maintaining the on state breakdown voltage large by forming the region including a high impurity concentration semiconductor and the region including a low impurity concentration semiconductor from the gate electrode side. The impurity concentration range of the region including a low impurity concentration semiconductor which can obtain the effect will be described using FIG. 22.

Figure 22:
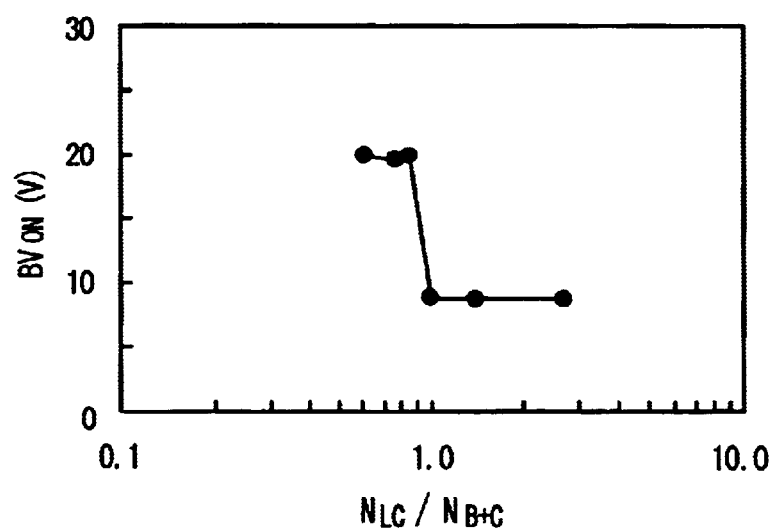
FIG. 22 is a diagram showing on state breakdown voltages and their dependence on the ratio of the sheet impurity concentration of a region including a low impurity concentration semiconductor to the sum of the sheet impurity concentrations of a barrier layer and a carrier providing layer existing from the end surface of a gate electrode at the side of a semiconductor substrate to a channel layer.

FIG. 22 is a diagram showing the on state breakdown voltages ($BV_{ON}$) and their dependence on the ratio ($N_{LC}/N_{B+C}$) of the sheet impurity concentration ($N_{LC}$) of the region 171 including a low impurity concentration semiconductor to the sum ($N_{B+C}$) of the sheet impurity concentrations of the barrier layer and the carrier providing layer existing from the end surface of the gate electrode at the side of the semiconductor substrate to the channel layer. As is apparent from the characteristic shown in FIG. 22, when the ratio $N_{LC}/N_{B+C}$ is 1.0 or above, the on state breakdown voltage $BV_{ON}$ is less than 10V. When the ratio is less than 1.0, the on state breakdown voltage is increased close to 20V.

When the sheet impurity concentration of the region 171 including a low impurity concentration semiconductor is increased, the on state breakdown voltage is reduced. This is because the effect for dividing the maximum region of the impact ionization factor into two is reduced so that the maximum region is easily concentrated onto one position close to the gate electrode. The sheet impurity concentration of the region 171 of this embodiment is $5.5 \times 10^{12}$ cm$^{-2}$. The sheet impurity concentration from the end surface of the gate electrode 132 at the side of the semiconductor substrate 101 to the end surface of the channel layer 105 opposite the semiconductor substrate 101 is $7.0 \times 10^{12}$ cm$^{-2}$ and the ratio $N_{LC}/N_{B+C}$ is about 0.85.

The ratio $N_{LC}/N_{B+C}$ is defined to stably obtain the large on state breakdown voltage $BV_{ON}$. This effect is particularly effective for the semiconductor device of the so-called depletion type having a threshold voltage of less than 0V.

<Embodiment 2>

Using FIGS. 10 to 15 and 16, another embodiment of the semiconductor device and the method of manufacturing thereof according to the present invention will be described. FIGS. 10 to 15 are essential part, sectional view showing the method of manufacturing the semiconductor device according to the present invention. FIG. 16 is an essential part, plan view.

Figure 10:
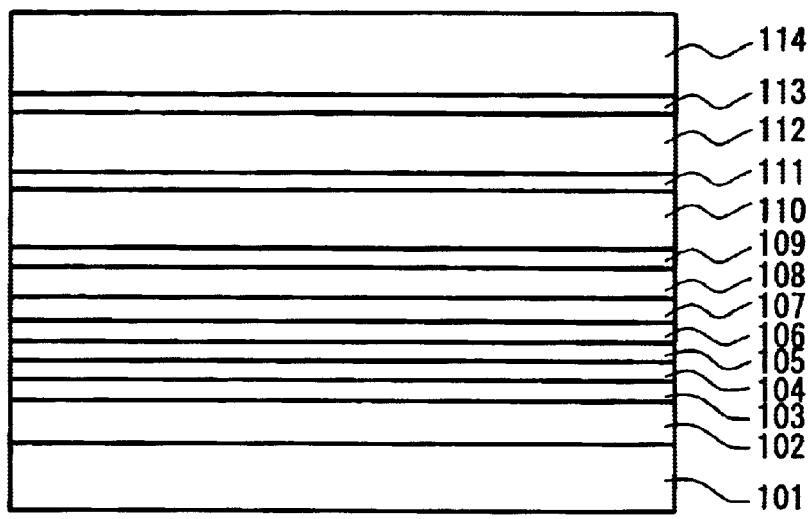
FIG. 10 is a first essential part, sectional structure diagram showing, in step order, another embodiment of the method of manufacturing the semiconductor device according to the present invention.
Figure 11:
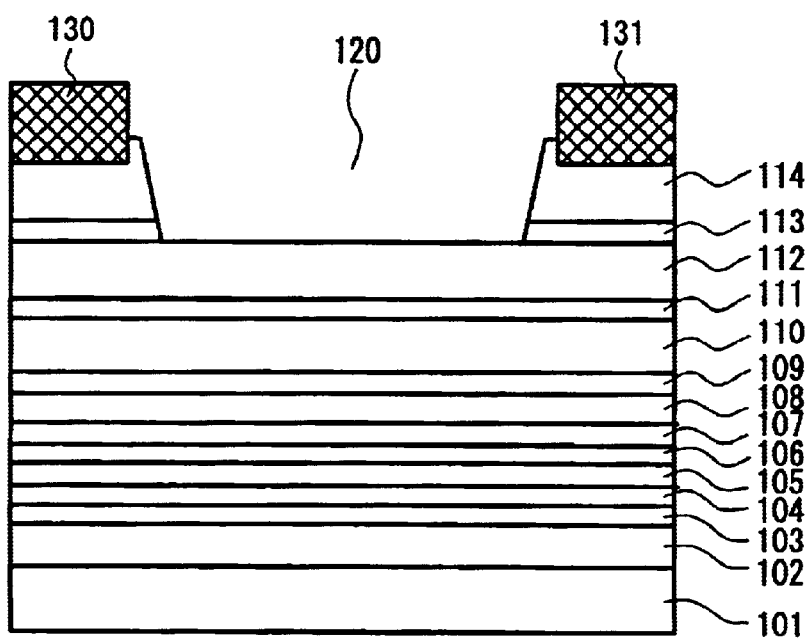
FIG. 11 is a sectional structure diagram of the semiconductor device showing the next step of FIG. 10.

On a semi-insulating GaAs substrate 101, using a MOCVD method, there are formed by the same composition and impurity concentration as Embodiment 1, a buffer layer 102 of non-doped AlGaAs having a thickness of 300 nm from the substrate side; a substrate side carrier providing layer 103 of n-AlGaAs having a thickness of 10 nm; a substrate side spacer layer 104 of non-doped AlGaAs having a thickness of 2 nm and non-doped GaAs having a thickness of 2 nm from the substrate side; a channel layer 105 of non-doped InGaAs having a thickness of 8 nm; a gate electrode side spacer layer 106 of non-doped GaAs having a thickness of 2 nm and non-doped AlGaAs having a thickness of 2 nm from the substrate side; a gate electrode side carrier providing layer 107 of n type AlGaAs having a thickness of 4 nm, a planar doped layer and n type AlGaAs having a thickness of 8 nm from the substrate side; a barrier layer 108 of n type AlGaAs having a thickness of 14 nm; and a first etching stop layer 109 of n type AlGaAs having a thickness of 3 nm, a planar doped layer and n type AlGaAs having a thickness of 2 nm from the substrate side (see FIG. 10).

Sequentially, using the MOCVD method, unlike Embodiment 1, there is conducted crystal growth of a cover layer 110 of n type GaAs (thickness: 30 nm, Si concentration: $5 \times 10^{17}$ cm$^{-3}$); a second etching stop layer 111 of n type AlGaAs (Al composition: 0.15, thickness: 3 nm, Si concentration: $5 \times 10^{18}$ cm$^{-3}$), a planar doped layer (Si sheet impurity concentration: $4 \times 10^{12}$ cm$^{-2}$) and n type AlGaAs (Al composition: 0.15, thickness: 3 nm, Si concentration: $5 \times 10^{18}$ cm$^{-3}$) from the substrate side; a first cap layer 112 of n type GaAs (thickness: 70 nm, Si concentration: $5 \times 10^{18}$ cm$^{-3}$); a third etching stop layer 113 of n type AlGaAs (Al composition: 0.15, thickness: 3 nm, Si concentration: $5 \times 10^{18}$ cm$^{-3}$), a planar doped layer (Si sheet impurity concentration: $4 \times 10^{12}$ cm$^{-2}$) and n type AlGaAs (Al composition: 0.15, thickness: 3 nm, Si concentration: $5 \times 10^{18}$ cm$^{-3}$) from the substrate side; and a second cap layer 114 of n type GaAs (thickness: 80 nm, Si concentration: $5 \times 10^{18}$ cm$^{-3}$) (see FIG. 10).

Isolation is conducted by mesa etching using a typical photolithography technique and a semiconductor wet etching technique to form an end surface of the active region of the semiconductor device (not shown). As a wet etching solution, a mixed solution of phosphoric acid, hydrogen peroxide and pure water is used.

Part of the second cap layer 114 is removed using the photolithography technique and a typical reactive ion etching technique. Part of the third etching stop layer 113 is removed by a wet process to form a channel 120. A source electrode 130 and a drain electrode 131 are formed by a metalizing technique and liftoff (see FIG. 11).

The stacked structure of AuGe/Mo/Au from the substrate side is used as the material of the source electrode 130 and the drain electrode 131 and is heat treated (400° C., 5 min) in a nitrogen atmosphere after material deposition. The etching gas used for the reactive ion etching is a mixed gas of SiCl$_4$ and CHF$_3$. The aqueous solution used for the wet process is an aqueous ammonia solution.

Figure 12:
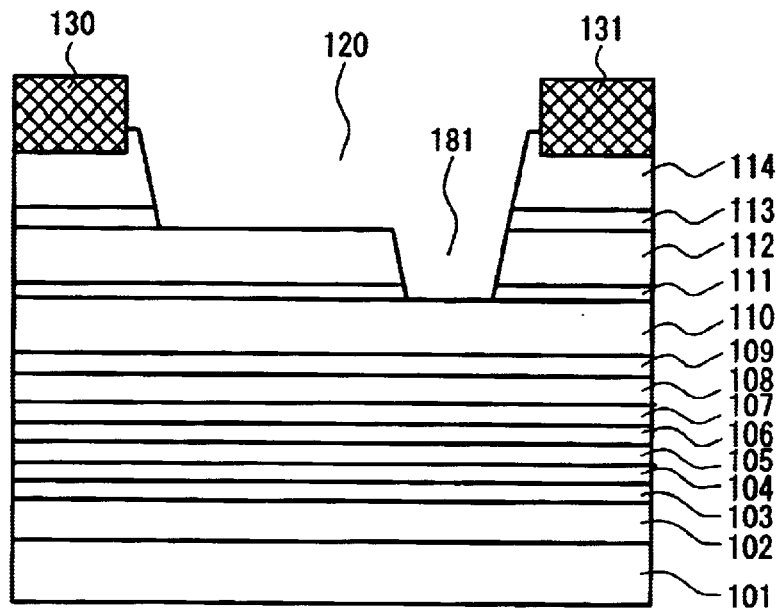
FIG. 12 is a sectional structure diagram of the semiconductor device showing the next step of FIG. 11.
Figure 13:
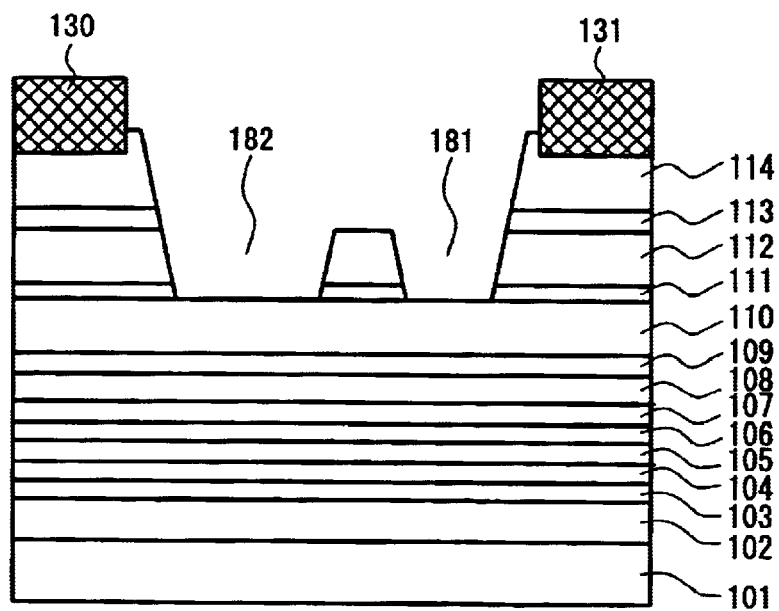
FIG. 13 is a sectional structure diagram of the semiconductor device showing the next step of FIG. 12.

After stacking an insulator film (not shown), a drain electrode side recess 181 is made using an electron beam drawing technique, an insulator film etching technique, a reactive ion etching technique and the above wet process technique (see FIG. 12). Further, a gate electrode forming recess 182 is made using the electron beam drawing technique, the insulator film etching technique, the reactive ion etching technique and the wet process technique (see FIG. 13).

Figure 14:
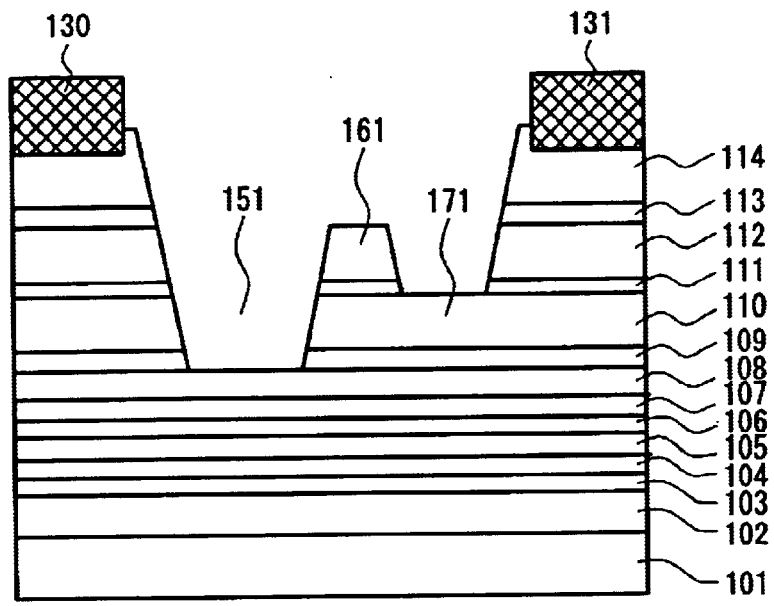
FIG. 14 is a sectional structure diagram of the semiconductor device showing the next step of FIG. 13.

A gate recess 151 is formed using the wet etching technique using a citric acid etching aqueous solution (see FIG. 14). The reference numerals 161 and 171 denote regions including a high impurity concentration semiconductor and a low impurity concentration semiconductor, respectively.

Figure 15:
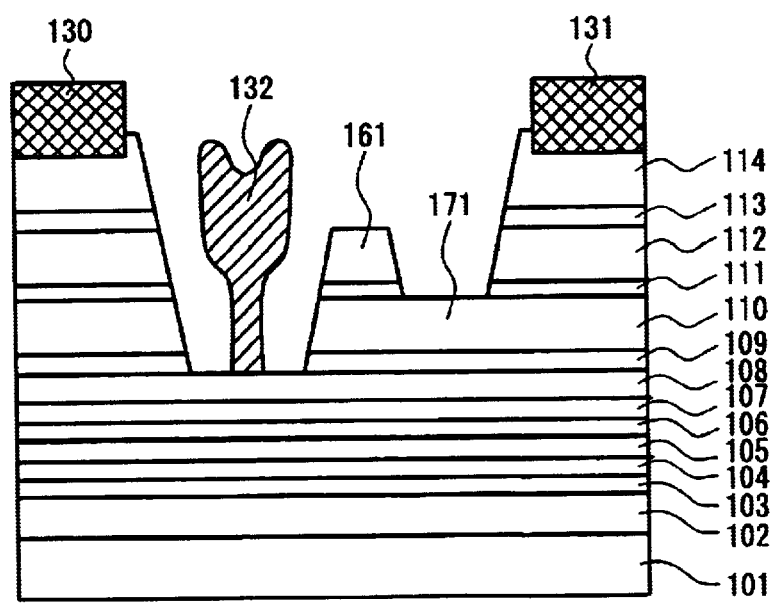
FIG. 15 is a sectional structure diagram of the semiconductor device showing the next step of FIG. 14.
Figure 16:
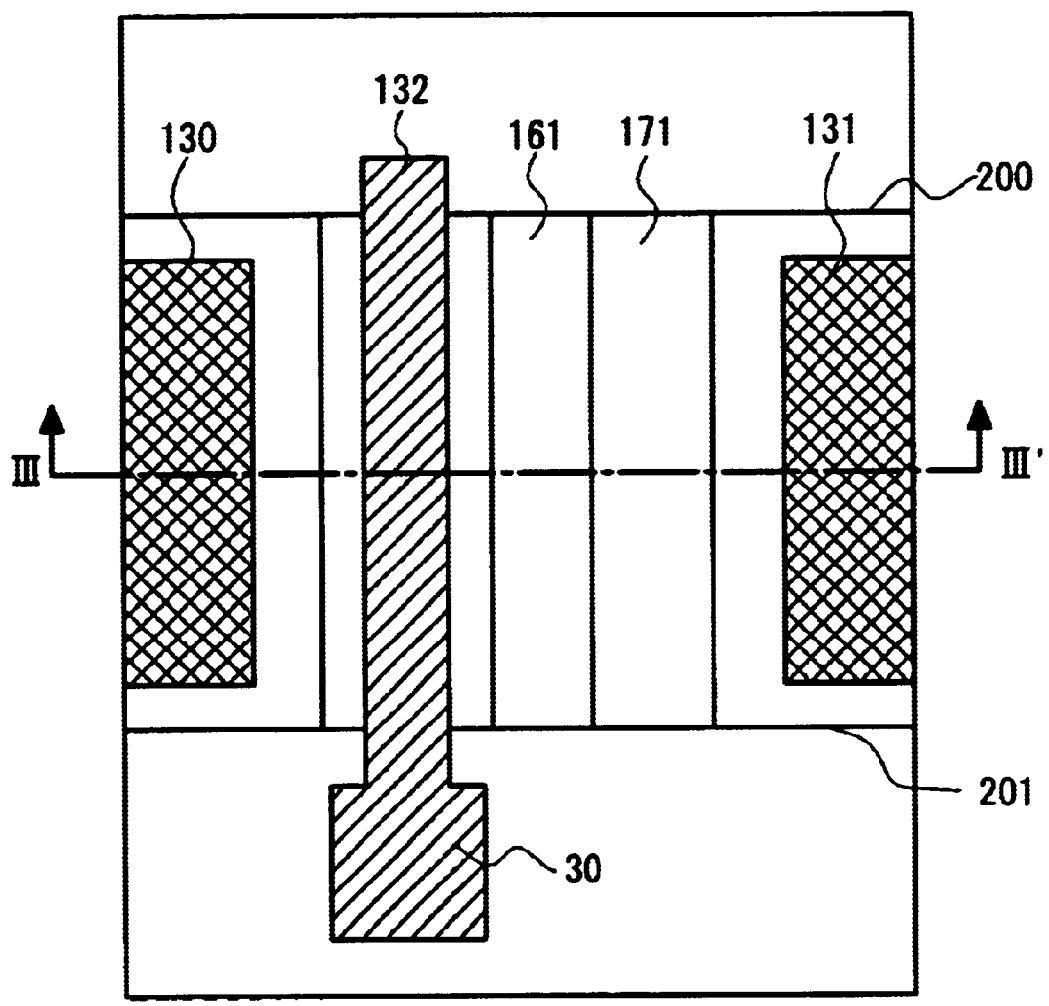
FIG. 16 is a plan view of the semiconductor device shown in FIG. 15.

A gate electrode 132 is formed using the deposition method to complete the semiconductor device (see FIG. 15).

FIG. 16 is an essential part, plan view of the semiconductor device shown in FIG. 15. As shown in FIG. 16, the region 161 including a high impurity concentration semiconductor and the region 171 including a low impurity concentration semiconductor are formed consecutively between one end surface 200 of an operating region of the semiconductor device and the other end surface 201 facing the end surface 200. The sectional view of FIG. 15 is a sectional structure of the part taken along line III–III' shown in FIG. 16. In FIG. 16, the reference numeral 30 denotes a wiring connection pad part of the gate electrode 132. In FIGS. 15 and 16, the wiring is omitted.

Figure 18:
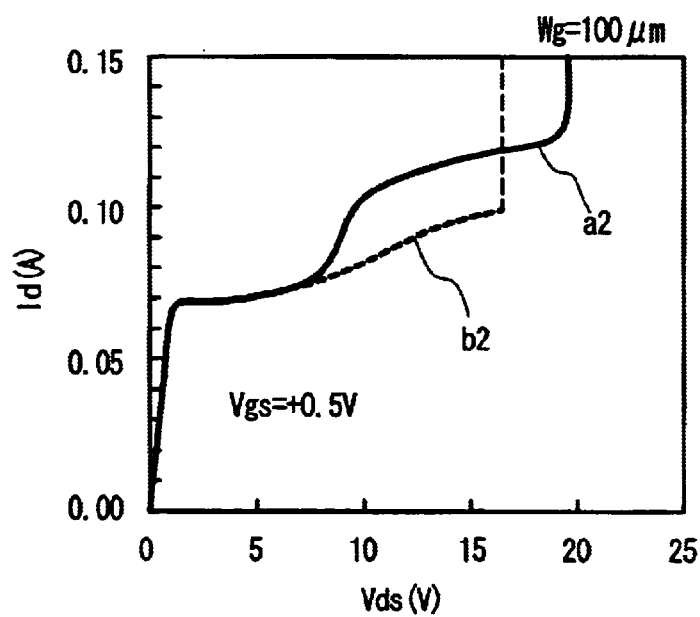
FIG. 18 is a characteristic diagram showing drain electric current characteristics to drain voltages of the semiconductor device according to the present invention of the structure shown in FIG. 15 and a prior art semiconductor device.

A drain electric current characteristic Id to a drain voltage Vds of the semiconductor device of this embodiment is indicated by a characteristic a2 of FIG. 18. The semiconductor device has a gate width Wg of 100 μm and a gate voltage Vgs of +0.5V. The on state breakdown voltage can be a very large value of about 19V which is almost the same as Embodiment 1. From the same reason as Embodiment 1, this embodiment has a sufficient drain voltage margin to breakdown of the semiconductor device and can suppress breakdown due to a surge voltage. The semiconductor device of this embodiment has a sufficient reliability.

When simulating the drain electric current characteristic to the drain voltage when using the technique described in the prior art example 4, Japanese Published Unexamined Patent Application No. Hei 10-214848, the result as indicated by the characteristic b2 of FIG. 18 is obtained. The semiconductor device has a threshold voltage of −1.5V, a gate width Wg of 100 μm, and a gate voltage Vgs of +0.5V. The on state breakdown voltage is about 16V. The breakdown voltage may respond to all high frequency systems typically used. In the case of a system having a power supply voltage of 5V, the maximum operating drain voltage of the semiconductor device is about 10V. The drain voltage margin to breakdown is small as about 6V. The drain voltage margin is insufficient.

The on state breakdown voltage when using the technique described in the prior art example 4 is not increased sufficiently. As in the case of using the prior art examples 1 to 3 described in Embodiment 1, the maximum region of the impact ionization factor G is concentrated onto one point (not shown). The on state breakdown voltage of the prior art example 4 is increased as compared with the prior art examples 1 to 3. The high concentration semiconductor layer between the gate electrode and the drain electrode does not exist (not shown). The maximum region of G is spread to the drain electrode side (not shown) The increased amount of G to increase of the drain voltage is smaller than the other prior art examples (not shown)

To sufficiently increase the on state breakdown voltage, as the structure shown in this embodiment, it is apparent that the region 161 including a high impurity concentration semiconductor must be formed between the gate electrode 132 and the region 171 including a low impurity concentration semiconductor. In this embodiment, the sheet impurity concentration of the region 171 is $5.5 \times 10^{12}$ cm$^{-2}$). The region 161 having an impurity concentration of $1.9 \times 10^{13}$ cm$^{-2}$ higher than the sheet impurity concentration is formed. The maximum region of the impact ionization factor G can be divided into two. The on state breakdown voltage can be a very large value of about 19V.

The sheet impurity concentration of the region 171 of this embodiment is $5.5 \times 10^{12}$ cm$^{-2}$, as in Embodiment 1. The sheet impurity concentration from the end surface of the gate electrode 132 at the side of the semiconductor substrate 101 to the end surface of the channel layer 105 opposite the semiconductor substrate 101 is $7.0 \times 10^{12}$ cm$^{-2}$ and the ratio is about 0.85.

As is apparent from Embodiments 1 and 2, the semiconductor device and the method of manufacturing thereof according to the present invention can realize the semiconductor device having a high frequency characteristic and a high breakdown voltage. It is particularly effective as a construction device of a high output amplifier in which a high breakdown voltage is important. The semiconductor device of the present invention is used to obtain a system having a high reliability resistant to surges.

The semiconductor device of the present invention can be applied widely not only in a high output amplifier but also in a generator, a receiver and a high frequency system having a power supply voltage of 2.5 to 5V typically used, specifically, a 1 to 2 GHz band cellular phone, a 5 to 30 GHz band high-speed data communication system, a 10 to 40 GHz band optical transmitting system, and a 60 to 80 GHz band radar system for preventing automobile collision.

The preferred embodiments of the present invention are described above. The present invention is not limited to the embodiments and various design modifications can be made within the scope without deviating from the spirit of the present invention.

As the crystal growth method when manufacturing the semiconductor device for use in Embodiments 1 and 2, an MBE (Molecular Beam Epitaxy) method may be used in place of the MOCVD method.

The cap layer 114 or 118 of the semiconductor device is not limited to GaAs. A material easily providing ohmic contact, for example, InGaAs may be used.

InGaAs having an In composition of 0.25 is used for the channel layer 105. The channel layer 105 may have a thickness not including dislocation with an In composition of about 0.1 to 0.4. The material is not limited to InGaAs and GaAsSb may be used.

In Embodiments 1 and 2, the material of the barrier layer is AlGaAs, but InGaP may be used. In this case, the material selectivity of the gate recess forming process is increased. The threshold voltage controllability of the semiconductor device is increased.

In the semiconductor device and the method of manufacturing thereof of Embodiments 1 and 2, the present invention is described with the case that the semiconductor layers other than channel layer 105 are lattice-matched on GaAs, the so-called p-HEMT (Psudomorphic-HEMT). Without being limited to the p-HEMT, it may be applied to HEMT such that the semiconductor layers are lattice-matched on InP. Further, it may be applied to MESFET (Metal Semiconductor Field Effect Transistor) and metamorphic HEMT described in K. Higuchi, M. Kudo, M. Mori, and T. Mishima, Japanese Journal of Applied Physics, Volume 35, Number 11 (1996) pp. 5642–5645) to obtain the same effect.

What is claimed is:

1. A semiconductor device in which on a semiconductor substrate, a buffer layer, a channel layer, a first conductivity type carrier providing layer and a barrier layer are formed from the side of the semiconductor substrate, and a source electrode, a drain electrode, a gate electrode between said source electrode and said drain electrode, an ohmic layer connected electrically to said source electrode, and an ohmic layer connected electrically to said drain electrode are formed, wherein a region including a first conductivity type high impurity concentration semiconductor and a region including a first conductivity type low impurity concentration semiconductor are formed from said gate electrode side at the side far from said semiconductor substrate of the end surface of said barrier layer opposite said semiconductor substrate and between said ohmic layer and said gate electrode, the sheet impurity concentration of said region including a low impurity concentration semiconductor is lower than that between the bottom surface of said gate electrode at the side of said semiconductor substrate and the end surface of said channel layer opposite said semiconductor substrate, the sheet impurity concentration of said region including a high impurity concentration semiconductor is higher than that of said region including a low impurity concentration semiconductor, and said region including a high impurity concentration semiconductor and said region including a low impurity concentration semiconductor are formed consecutively between one end surface of an operating region of the semiconductor device and the other end surface facing the end surface, respectively.

2. The semiconductor device according to claim 1, wherein said channel layer is of InGaAs and said barrier layer is of AlGaAs.

3. The semiconductor device according to claim 1, wherein said channel layer is of InGaAs and said barrier layer is of InGaP.

4. A method of manufacturing the semiconductor device comprising the steps of:

stacking, on a semiconductor substrate, a buffer layer, a channel layer, a first conductivity type carrier providing layer, a barrier layer and a first conductivity type ohmic layer from the side of the semiconductor substrate;

forming, between a gate electrode formed in the later step and said drain electrode, a region including a low impurity concentration semiconductor having a sheet impurity concentration lower than that between the bottom surface of said gate electrode at the side of said semiconductor substrate and the end surface of said channel layer opposite said semiconductor substrate so as to be consecutive between one end surface of an operating region of the semiconductor device and the other end surface facing the end surface;

forming, between said gate electrode and said region including a low impurity concentration semiconductor, a region including a high impurity concentration semiconductor having a sheet impurity concentration higher than that of said region including a low impurity concentration semiconductor so as to be consecutive between one end surface of an operating region of the semiconductor device and the other end surface facing the end surface; and forming said gate electrode.

5. The method of manufacturing the semiconductor device according to claim 4, wherein said channel layer is of InGaAs and said barrier layer is of AlGaAs.

6. The method of manufacturing the semiconductor device according to claim 4, wherein said channel layer is of InGaAs and said barrier layer is of InGaP.

* * * * *